(12) United States Patent
Choi et al.

(10) Patent No.: US 7,948,173 B2
(45) Date of Patent: May 24, 2011

(54) ORGANIC LIGHT EMITTING DIODE DISPLAY AND METHOD OF MANUFACTURING THE SAME

(75) Inventors: Min-Hyuk Choi, Cheongan-si (KR); Chun-Gi You, Hwaseong-si (KR); Dong-Ki Lee, Seongnam-si (KR); Young-Dong Kwon, Asan-si (KR); Jin-Hee Kang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 247 days.

(21) Appl. No.: 12/343,266

(22) Filed: Dec. 23, 2008

(65) Prior Publication Data

US 2009/0315451 A1    Dec. 24, 2009

(30) Foreign Application Priority Data

Jun. 23, 2008  (KR) .................. 10-2008-0059042

(51) Int. Cl.
*H01J 1/62* (2006.01)
(52) U.S. Cl. ...................... 313/506; 313/504
(58) Field of Classification Search .................. 313/498, 313/504, 506, 509
See application file for complete search history.

(56) References Cited

U.S. PATENT DOCUMENTS

| 2005/0236956 | A1 | 10/2005 | Chung et al. |
| 2007/0152222 | A1 | 7/2007 | Joo |

FOREIGN PATENT DOCUMENTS

| JP | 2002-270372 | 9/2002 |
| JP | 2004-165068 | 6/2004 |
| JP | 2006-251281 | 9/2006 |
| JP | 2007-250244 | 9/2007 |
| KR | 100490043 | 5/2005 |
| KR | 10 20050094561 | 9/2005 |
| KR | 10-20060040427 | 5/2006 |
| KR | 10-2006-0112964 | 11/2006 |
| KR | 100711889 | 4/2007 |
| KR | 100712108 | 4/2007 |
| KR | 100730151 | 6/2007 |
| KR | 100759680 | 9/2007 |
| KR | 10-20080001746 | 1/2008 |

OTHER PUBLICATIONS

English Abstract, Publication No. JP 2004-165068.
English Abstract, Publication No. JP 2006-251281.
English Abstract, Publication No. JP 2007-250244.
English Abstract, Publication No. JP 2002-270372.
English Abstract, Publication No. KR 100490043.
English Abstract, Publication No. KR 100711889.
English Abstract, Publication No. KR 100712108.

(Continued)

*Primary Examiner* — Vip Patel
(74) *Attorney, Agent, or Firm* — Innovation Counsel LLP

(57) ABSTRACT

The present invention relates to an organic light emitting diode display and a method for manufacturing the same, including: a substrate; first signal lines formed on the substrate and including first pad units; second signal lines that intersect the first signal lines and include second pad units; first thin film transistors that are electrically connected to the first signal lines and the second signal lines; second thin film transistors that are electrically connected to the first thin film transistors; pixel electrodes that are electrically connected to the second thin film transistors; common electrodes facing the pixel electrodes; light emitting members that are formed between the pixel electrodes and the common electrodes; contact assistants that are formed on the first pad units and the second pad units; and protective partitions that enclose circumferences of the contact assistants.

11 Claims, 10 Drawing Sheets

OTHER PUBLICATIONS

English Abstract, Publication No. KR 100730151.
English Abstract, Publication No. KR 10-2006-0112964.
English Abstract, Publication No. KR 100759680.
English Abstract, Publication No. KR 10 20050094561.
English Abstract, Publication No. KR 10-20060040427.
English Abstract, Publication No. KR 10-20080001746.

ORGANIC LIGHT EMITTING DIODE DISPLAY AND METHOD OF MANUFACTURING THE SAME

CROSS-REFERENCE TO RELATED APPLICATION

This application claims priority to and the benefit of Korean Patent Application No. 10-2008-0059042 filed in the Korean Intellectual Property Office on Jun. 23, 2008, the entire contents of which are incorporated herein by reference.

BACKGROUND (a) Technical Field

The present invention relates to an organic light emitting diode display and a method of manufacturing the same.

(b) Related Art

Recently, demand for a light and slim monitor, television, or similar devices have been ever increasing. One display device of interest satisfying this demand is an organic light emitting diode display(OLED display).

The organic light emitting diode display, which includes two electrodes and an emission layer positioned therebetween, combines electrons injected from one electrode and holes injected from the other at the emission layer to form excitons, and emits light when the excitons emit energy.

The organic light emitting diode display does not need a separate light source because it is a self-emission type. Accordingly, the OLED display is advantageous in power consumption and excellent in response speed, viewing angle, and contrast ratio.

However, since the emission layer of the organic light emitting diode display emits light in all directions, studies for improving luminous efficiency in a specific direction has progressed. Some of these studies have involved forming a reflecting electrode in one of the two electrodes.

SUMMARY

In one embodiment the present invention provides an organic light emitting diode display comprising: a substrate; a first signal line disposed on the substrate and includes a first pad unit; a second signal line that intersects the first signal line and includes a second pad unit; a first thin film transistor electrically connected to the first signal line and the second signal line; a second thin film transistor electrically connected to the first thin film transistor; a pixel electrode electrically connected to the second thin film transistor; a common electrode facing the pixel electrode; a light emitting member disposed between the pixel electrode and the common electrode; a contact assistant disposed on the first pad unit and the second pad unit; and protective partitions that enclose the contact assistant.

In other embodiments, the pad unit assistant member may further be disposed between the first pad unit and the contact assistant. The pad unit assistant member may comprise the same material as the second signal line. A partition may further be disposed on the pixel electrode. The partition and the protective partition may comprise the same material. The thickness of the partition may be greater than that of the protective partition. The protective partition may comprise an organic insulating material such as acryl resin or polyimide resin. The protective partition may comprise an inorganic material such as silicon oxide or titanium oxide. The pixel electrode and the contact assistant may comprise the same material. The contact assistant may comprise a lower transparent electrode, a reflecting electrode disposed on the lower transparent electrode and an upper transparent electrode disposed on the reflecting electrode. The reflecting electrode may comprise at least one of silver (Ag), palladium (Pd), and platinum (Pt).

In another embodiment the present invention provides a method of manufacturing an organic light emitting diode display comprising: forming a first signal line disposed on a substrate and includes a first pad unit; forming a second signal line that intersects the first signal line and includes a second pad unit; forming a thin film transistor electrically connected to the first signal line and the second signal line; forming a contact assistant on the first pad unit and the second pad unit; forming a pixel electrode on the thin film transistor; forming a light emitting member on the pixel electrode; forming a protective partition to enclose the contact assistant; and forming a common electrode on the light emitting member.

In still other embodiments, the forming of the protective partition may include the forming of the partition on the pixel electrode. The protective partition may be formed to be thinner than the partition by using a slit mask. The contact assistants may be formed by sequentially stacking a lower transparent electrode layer, a reflecting electrode layer, and an upper transparent electrode layer, and then simultaneously performing photolithography on them.

According to an embodiment of the present invention, the protective partition is formed in the pad unit of the organic light emitting diode display, making it possible to prevent problems such as corrosion due to the reflecting electrode of the pad unit.

It is to be understood that both the foregoing general description and the following detailed description are exemplary and explanatory and are intended to provide further explanation of the invention as claimed.

DETAILED DESCRIPTION OF THE EMBODIMENTS

Figure 1:
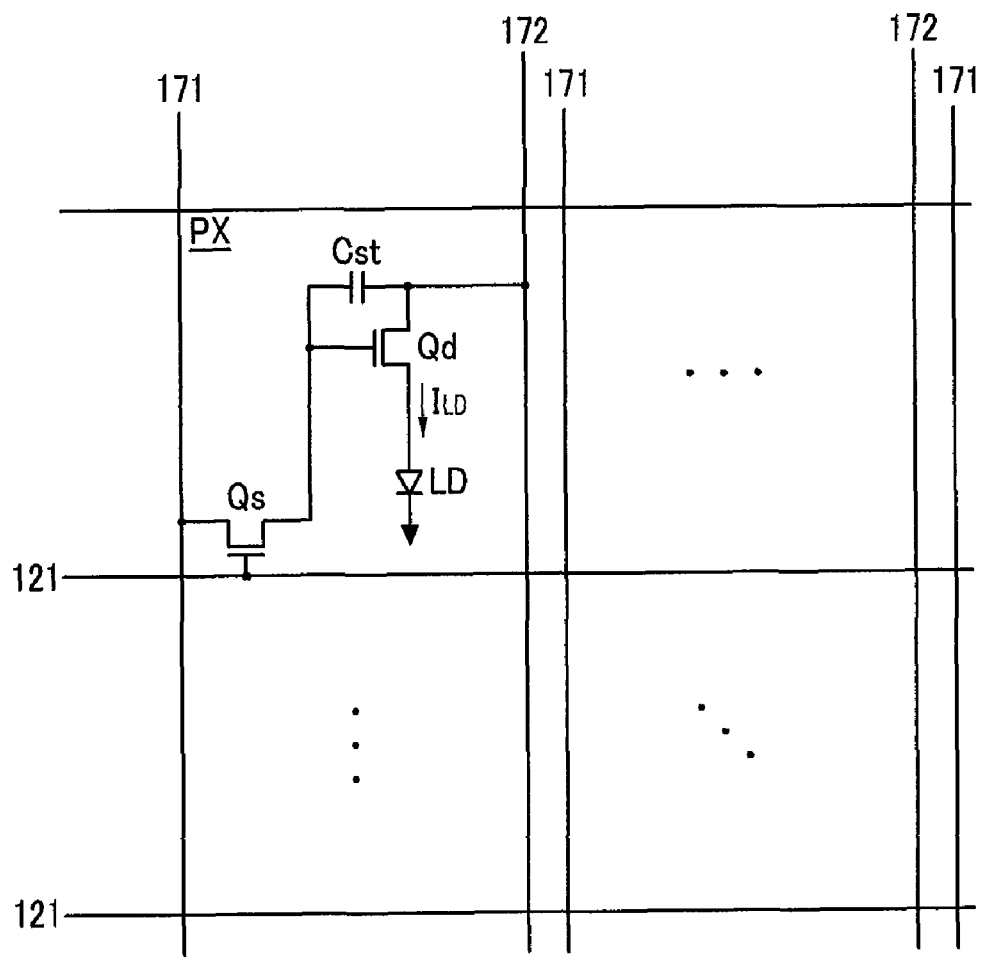
FIG. 1 is an equivalent circuit diagram of an organic light emitting diode display according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, an organic light emitting diode display according to an exemplary embodiment of the present invention will be described in detail with reference to FIG. 1.

FIG. 1 is an equivalent circuit diagram of an organic light emitting diode display according to an exemplary embodiment of the present invention.

Referring to FIG. 1, an organic light emitting diode display according to the present exemplary embodiment includes a plurality of signal lines 121, 171, and 172, and a plurality of pixels PX that are connected to the plurality of signal lines 121, 171, and 172 and are arranged in an approximate matrix form.

The signal lines include a plurality of gate lines 121 that transfer gate signals (or scanning signals), a plurality of data lines 171 that transfer data signals, and a plurality of driving voltage lines 172 that transfer driving voltages. The gate lines 121 extend in an approximate row direction and are approximately parallel to each other, and the data lines 171 and the driving voltage lines 172 extend in an approximate column direction and are parallel to each other.

Each pixel PX includes a switching transistor Qs, a driving transistor Qd, a storage capacitor Cst, and an organic light emitting diode (OLED) LD.

The switching transistor Qs includes a control terminal, an input terminal, and an output terminal, wherein the control terminal is connected to the gate line 121, the input terminal is connected to the data line 171, and the output terminal is connected to the driving transistor Qd.

The switching transistor Qs responds to a scanning signal applied to the gate line 121 to transfer the data signal applied to the data line 171 to the driving transistor Qd. The driving transistor Qd also includes a control terminal, an input terminal, and an output terminal, wherein the control terminal is connected to the switching transistor Qs, the input terminal is connected to the driving voltage line 172, and the output terminal is connected to the organic light emitting diode LD.

The driving transistor Qd transfers an output current $I_{LD}$ of which the magnitude varies depending on a voltage applied between the control terminal and the output terminal.

The capacitor Cst is connected between the control terminal and the input terminal of the driving transistor Qd. The capacitor Cst is charged with the data signal applied to the control terminal of the driving transistor Qd and maintains it even after the switching transistor Qs is turned off.

The organic light emitting diode LD includes an anode connected to the output terminal of the driving transistor Qd and a cathode connected to a common voltage Vss. The organic light emitting diode LD emits light of different intensities depending on the output current $I_{LD}$ of the driving transistor Qd, thereby displaying an image.

The switching transistor Qs and the driving transistor Qd are n-channel electric field effect transistors (FETs). However, at least one of the switching transistor Qs and the driving transistor Qd may be a p-channel electric field effect transistor. Also, the connection relation of the transistors (Qs and Qd), the capacitor Cst, and the organic light emitting diode LD may be changed.

Hereinafter, the detailed structure of the organic light emitting diode display shown in FIG. 1 will be described in detail with reference to FIG. 2 and FIG. 3.

Figure 2:
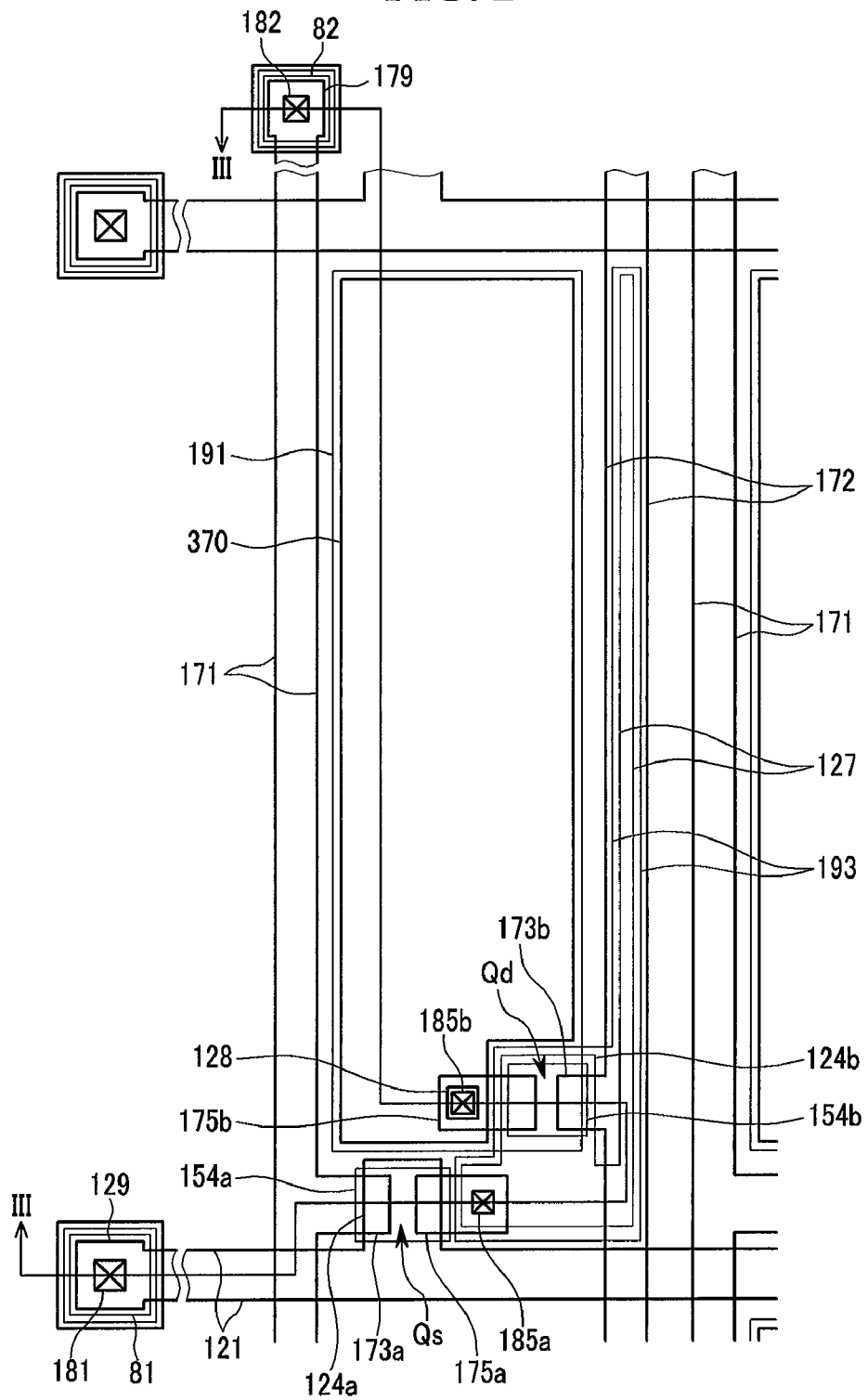
FIG. 2 is a layout view of an organic light emitting diode display according to an exemplary embodiment of the present invention.
Figure 3:
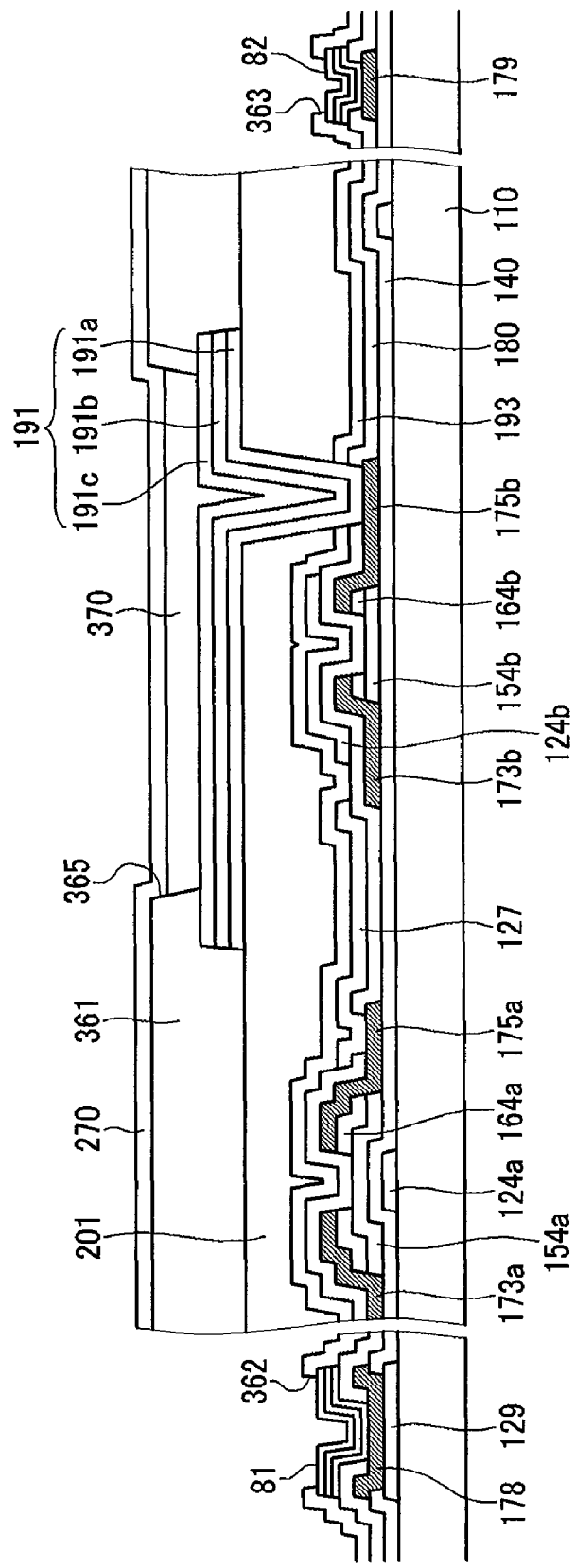
FIG. 3 is a cross-sectional view taken along line III-III of the organic light emitting diode display shown in FIG. 2.

FIG. 2 is a layout view of the organic light emitting diode display according to an exemplary embodiment of the present invention, and FIG. 3 is a cross-sectional view taken along line III-III of the organic light emitting diode display shown in FIG. 2.

A plurality of gate lines 121 each including a first control electrode 124a are formed on an insulation substrate 110 comprising materials such as transparent glass or plastic.

The gate lines 121 transfer gate signals and generally extend in a horizontal direction. Each gate line 121 includes a first pad unit 129 having a wide area connected to other layers or an external driving circuit, and the first control electrode 124a extends upward from the gate line 121.

The gate lines 121 may comprise an aluminum series metal such as aluminum (Al) or an aluminum alloy, a silver series metal such as silver (Ag) or a silver alloy, a copper series metal such as copper (Cu) or a copper alloy, a molybdenum series metal such as molybdenum (Mo) or a molybdenum alloy, chromium (Cr), tantalum (Ta), titanium (Ti), or the like. However, they may have a multilayer structure including two conductive layers (not shown) with different physical properties.

The sides of the gate lines 121 are tilted with respect to the surface of the substrate 110, and the tilt angle is preferably about 30° to about 80°.

A lower gate insulating layer 140 comprising materials such as silicon nitride ($SiN_x$) or silicon oxide ($SiO_x$) is formed on the gate lines 121. A first semiconductor 154a and a second semiconductor 154b are formed on the lower gate insulating layer 140. The first semiconductor 154a and the second semiconductor 154b may comprise microcrystalline silicon or polysilicon (polycrystalline silicon).

A pair of first ohmic contacts 164a and a pair of second ohmic contacts 164b are formed on each of the first semiconductors 154a and the second semiconductors 154b, respectively. The ohmic contacts 164a and 164b have an island shape, and may comprise materials such as n+ hydrogenated amorphous silicon doped with a high concentration of an n-type impurity, such as phosphorus (P), or microcrystalline silicon.

A plurality of data conductors including the plurality of data lines 171, the plurality of driving voltage lines 172, and a plurality of first and second output electrodes 175a and 175b are formed on the ohmic contacts 164a and 164b and the gate insulating layer 140.

The data lines 171 transfer the data signals and extend generally in a vertical direction to intersect the gate lines 121. Each data line 171 includes a second pad unit 179 having a wide area to connect a plurality of first input electrodes 173a extending to the first control electrode 124a with other layers or an external driving circuit.

The driving voltage lines 172 transfer driving voltages and generally extend in a vertical direction to intersect the gate lines 121. Each driving voltage line 172 includes a plurality of second input electrodes 173b.

The first and second output electrodes 175a and 175b are separated from each other and are also separated from the data lines 171 and the driving voltage lines 172.

The first input electrode 173a and the first output electrode 175a face each other based on the first semiconductor 154a, and the second input electrode 173b and the second output electrode 175b face each other based on the second semiconductor 154b.

The data conductors 171, 172, 175a, and 175b may comprise low resistance metals such as aluminum, copper, silver, or alloys thereof, or refractory metals such as molybdenum, chromium, tantalum, titanium, or alloys thereof, and may have a multilayer structure including a refractory metal layer (not shown) and a low resistance conductive layer (not shown).

Like the gate lines 121, the sides of the data conductors 171, 172, 175a, and 175b are preferably tilted with respect to the substrate 110 at tilt angles of about 30° to 80°.

An upper gate insulating layer 180 may comprise materials such as silicon nitride or silicon oxide is formed on the data conductors 171, 172, 175a, and 175b, the exposed semiconductor portions 154a and 154b, and the lower gate insulating layer 140.

The upper gate insulating layer 180 is formed with a plurality of contact holes 185a and 185b to expose the first output electrodes 175a and the second output electrodes 175b.

Second control electrodes 124b are formed on the upper gate insulating layer 180. Each second control electrode 124b overlaps a second semiconductor 154b and includes a storage electrode 127. The storage electrode 127 overlaps the driving voltage line 172. The second control electrode 124b is connected to the first output electrode 175a via the contact hole 185a. The second electrodes 124b may comprise the same material as the gate lines 121. The sides of the second control electrodes 124b are tilted with respect to the surface of the substrate 110, and the tilt angle is preferably about 30° to 80°.

A plurality of protective members 193 having a plurality of contact holes 181 and 182 are formed on the second control electrodes 124b and the upper gate insulating layer 180. The protective members 193 may comprise materials such as silicon oxide, silicon nitride, and perform a role of a passivation layer to protect the data conductors 171, 172, 175a, and 175b and the second pad unit 179.

The protective member 193 covers the second control electrode 124b. The protective member 193 is formed on the second control electrode 124b so that the second control electrode 124b, comprised of a conductor with weak chemical resistance, cannot be damaged by a chemical liquid, such as an etchant, in a subsequent process.

An interlayer insulating layer 201 having a contact hole 201a is formed on the protective member 193. The interlayer insulating layer 201 is formed with sufficient thickness to be able to planarize a region that is formed with the switching transistor Qs and the driving transistor Qd, and may comprise an organic material such as a polyimide, a benzocyclobutene series resin, and an acrylate.

A pixel electrode 191 and a plurality of contact assistants 81 and 82 are formed on the interlayer insulating layer 201 and the protective member 193. The pixel electrode 191 and the plurality of contact assistants 81 and 82 may be three-layer structures of a lower pixel electrode 191a, a reflecting electrode 191b, and an upper pixel electrode 191c.

A portion of the lower pixel electrode 191a may be connected to the second output electrode 175 via the contact hole 201a, and a portion of the lower pixel electrode 191a, the reflecting electrode 191b, and the upper pixel electrode 191c, respectively, may be included at the inside of the contact hole 201a. The lower pixel electrode 191a is formed at a thickness of about 50-200 Å using transparent metal materials, such as indium tin oxide (ITO), indium zinc oxide (IZO). The lower pixel electrode 191a is formed to improve the interface characteristic between the protective member 193 and the reflecting electrode 191b formed through a subsequent process, that is, the adhesive property.

The reflecting electrode 191b may comprise a metal having a reflectance of about 80% such as silver (Ag), palladium (Pd) or platinum (Pt). The reflecting electrode is formed at a thickness of about 1000-3000 Å. The reflecting electrode 191b performs a role of light reflection, making it possible to increase luminance and light efficiency.

The upper pixel electrode 191c is formed on the reflecting electrode 191b. The upper pixel electrode 191c may be formed at a thickness of about 50-200 Å using transparent metal materials such as ITO, IZO.

The contact assistants 81 and 82 are respectively connected to the first pad unit 129 of the gate line 121 and the second pad unit 179 of the data line 171 via the contact holes 181 and 182. The contact assistants 81 and 82 supplement the adhesive property between the first pad unit 129 and the second pad unit 179 and external driving circuits; and protect them.

A partition 361 and protective partitions 362 and 363 are formed on the pixel electrode 191 and the protective member 193. The partition 361 encloses the edge circumference of the pixel electrode 191 like a bank to define an opening 365. The protective partitions 362 and 363 respectively enclose the edge circumferences of the contact assistants 81 and 82. These protective partitions 362 and 363 perform a role of preventing a corrosion problem and a yellowing phenomenon caused when the contact assistants 81 and 82 are exposed to the outside.

The thickness of the protective partitions 362 and 363 is formed to be not thicker than that of the partitions 361, making it possible to improve the adhesive property between the contact assistants 81 and 82 and the external devices.

The partition 361 and the protective partitions 362 and 363 may comprise an organic insulator with heat resistance and solvent resistance, such as acrylic resin, polyimide resin, or an inorganic insulator, such as silicon oxide ($SiO_2$), titanium oxide ($TiO_2$), and may be formed of two layers or more. The partition 361 may comprise a photosensitive material including a black pigment. In this case, the partition 361 performs a role of a light blocking member and its formation process is simple.

The opening 365 on the pixel electrode 191 defined by the partition 361 is formed with an organic light emitting member 370.

The organic light emitting member 370 may have a multi-layered structure that includes an emission layer (emitting layer) (not shown) emitting light as well as an auxiliary layer (not shown) improving luminous efficiency of the emission layer.

The emission layer may comprise an organic material inherently emitting light of any one of primary colors, such as three primary colors of red, green, and blue, or a mixture of an organic material and an inorganic material. The organic materials may include a polyfluorene derivative, a (poly)paraphenylenevinylene derivative, a polyphenylene derivative, a polyfluorene derivative, polyvinylcarbazole, or a polythiophene derivative, or compounds such as perylene series coloring materials, cumarine series coloring materials, rodermine series coloring materials, rubrene, perylene, 9,10-diphenylanthracene, tetraphenylbutadiene, Nile red, coumarin, quinacridone, etc., doped in these polymer materials. The organic light emitting diode display displays a desired image by a spatial sum of primary color light emitted from the emission layer.

The auxiliary layer may include an electron transport layer (not shown) and a hole transport layer (not shown) for balancing electrons and holes and an electron injecting layer for enhancing the injection of electrons and holes, or the like. The auxiliary layer may include one or more selected layers. The hole transport layer and the hole injecting layer may comprise a material having an approximately intermediate work function of the pixel electrode 191 and the emission layer, and the electron transport layer and the electron injecting layer may comprise a material having an approximately intermediate work function of a common electrode 270 and the emission layer. For example, the hole transport layer or the hole injecting layer may comprise a mixture of poly-(3,4-ethylenedioxythiophene), polystyrenesulfonate, (PEDOT and PSS).

The common electrode 270 is formed on the organic light emitting member 370. The common electrode 270 is formed over the substrate, and forms a pair with a pixel electrode 191 to transfer a current to the organic light emitting member 370.

In the organic light emitting diode display, the first control gate 124a connected to the gate line 121, the first input electrode 173a connected to the data line 171, and the first output electrode 175a form the switching thin film transistor (TFT) Qs together with the semiconductor 154a, and a channel of the switching thin film transistor Qs is formed in the first semiconductor 154a between the first input electrode 173a and the first output electrode 175a. The second control electrode 124b connected to the first output electrode 175a, the second input electrode 173b connected to the driving voltage line 172, and the second output electrode 175b connected to the pixel electrode 191 forms the driving thin film transistor (TFT) Qd together with the second semiconductor 154b, and a channel of the driving thin film transistor Qd is formed in the second semiconductor 154b between the second input electrode 173b and the second output electrode 175b.

Although the present exemplary embodiment shows only one switching thin film transistor and only one thin film transistor, it further includes at least one thin film transistor and wiring for driving the at least one thin film transistor in addition to the switching thin film transistor and the thin film transistor, such that degradation of the organic light emitting diode LD and the driving transistor Qd can be prevented or compensated even during long term driving, making it possible to prevent a reduction in the lifetime of the organic light emitting diode display.

A pixel electrode 191, the organic light emitting member 370, and the common electrode 270 form the organic light emitting diode LD, and the pixel electrode 191 becomes an anode and the common electrode 270 becomes a cathode, or vice versa. Also, the storage electrode 127 and the driving voltage line 172, which are overlapped with each other, form the storage capacitor Cst.

Hereinafter, a method for manufacturing the organic light emitting diode display shown in FIG. 2 and FIG. 3 will be described in detail with reference to FIG. 4 to FIG. 9.

FIG. 4 to FIG. 9 are cross-sectional views of intermediate steps of a method for manufacturing the organic light emitting diode display of FIG. 2 and FIG. 3 according to an exemplary embodiment of the present invention.

Figure 4:
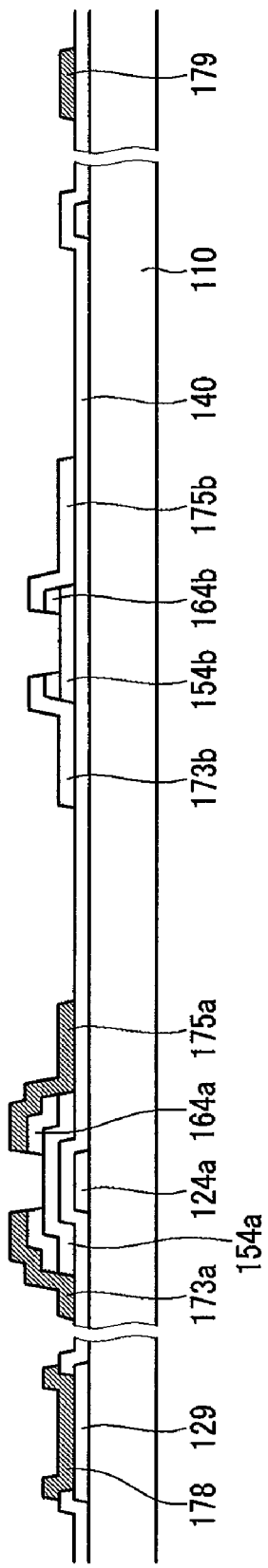
FIG. 4 to FIG. 10 are cross-sectional views at intermediate steps of a method for manufacturing an organic light emitting diode display in FIG. 2 and FIG. 3 according to an exemplary embodiment of the present invention.

As shown in FIG. 4, the plurality of gate lines 121 including the first pad units 129 and the first control electrode 124a comprising a metal such as an aluminum alloy are formed on the substrate 110.

Next, the gate insulating layer is deposited by chemical vapor deposition (plasma enhanced chemical vapor deposition, PECVD) and is then subjected to photolithography, thereby forming the lower gate insulating layer 140 that exposes the first pad units 129 of the plurality of gate lines 121.

Then, an intrinsic amorphous silicon layer and an impurity amorphous silicon layer are successively stacked by the chemical vapor deposition (PECVD).

Thereafter, the impurity amorphous silicon layer and the intrinsic amorphous silicon layer are subjected to photolithography, thereby forming the plurality of first and second ohmic contacts 164a and 164b and the plurality of first and second semiconductors 154a and 154b. At this time, the plurality of first and second ohmic contacts 164a and 164b and the plurality of first and second semiconductors 154a and 154b can be crystallized by crystallization methods such as excimer laser annealing (ELA), sequential lateral solidification (SLS), solid phase crystallization (SPC), or the like.

Next, the data conductors, which include the plurality of data lines 171 including the first input electrodes 173a and the second pad units 179 comprising an aluminum alloy, the driving voltage lines 172 including the second input electrodes 173b, and the plurality of first and second output electrodes 175a and 175b, are formed.

At this time, a pad unit assistant member 178 may comprise the same material as the data conductor on the first pad unit 129.

The pad unit assistant member 178 performs a role of electrically connecting the first pad unit 129 and the subsequently formed contact assistant 81.

Figure 5:
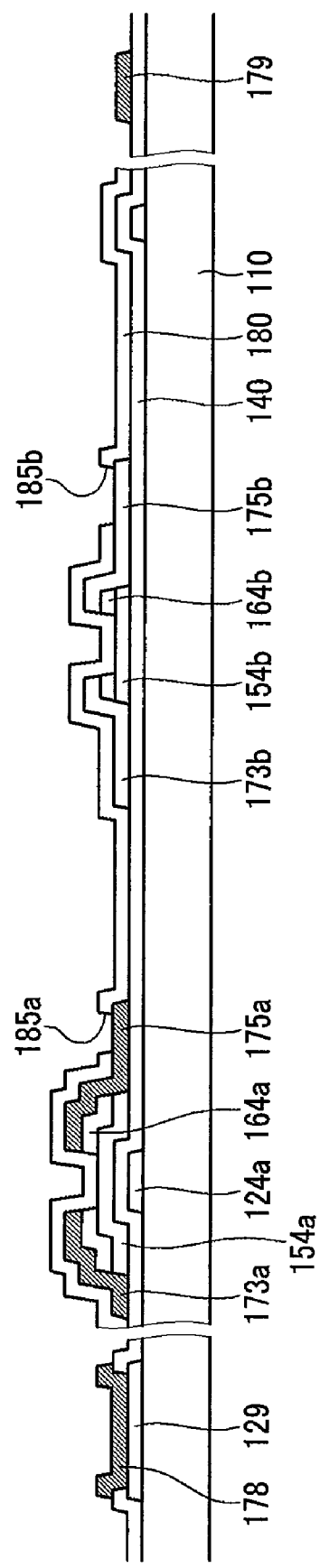

Next, as shown in FIG. 5, the upper gate insulating layer is stacked over the substrate by chemical vapor deposition and is subjected to photolithography to form the upper gate insulating layer 180 having the plurality of contact holes 185a and 185b.

Figure 6:
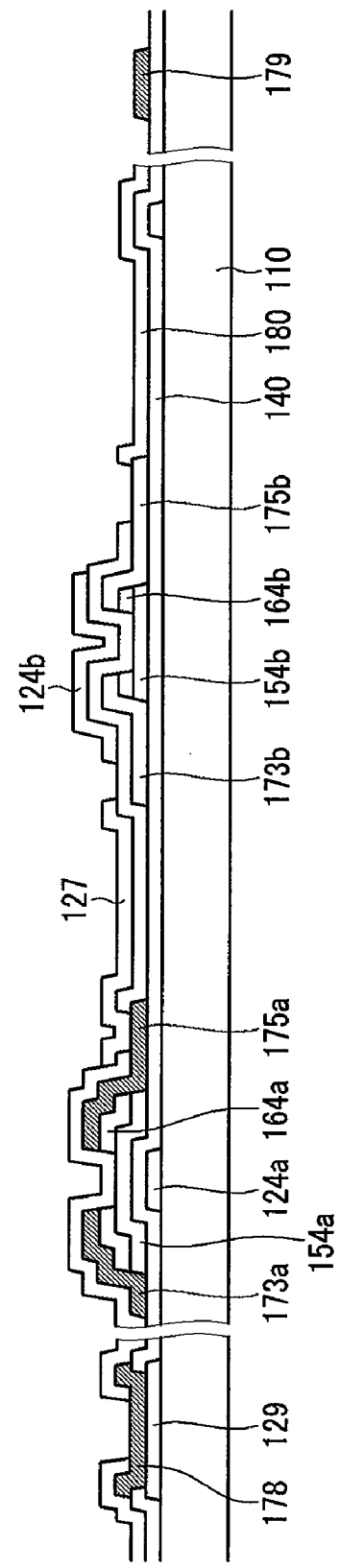

Then, as shown in FIG. 6, a conductive layer comprising a material such as an aluminum alloy is stacked and is subjected to photolithography to form the second control electrode 124b including the storage electrode 127.

Figure 7:
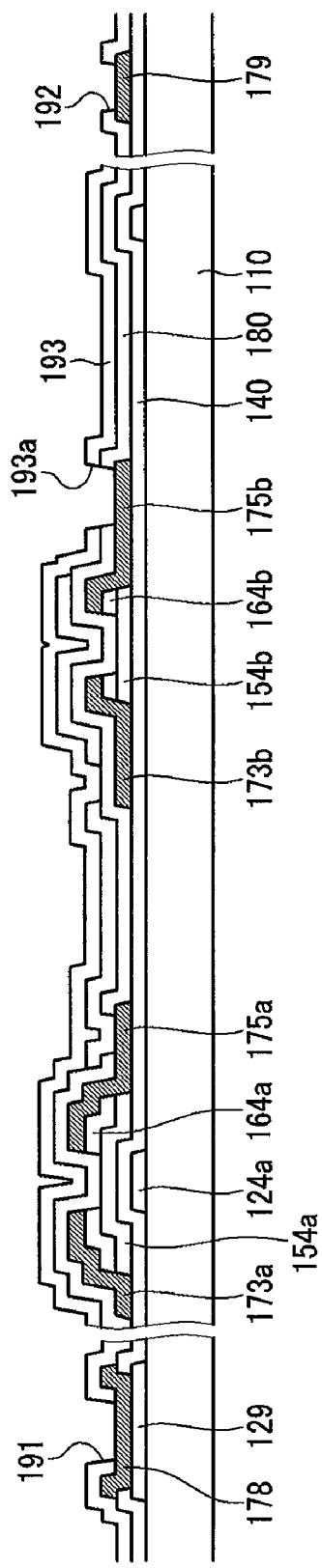

Thereafter, as shown in FIG. 7, the protective member 193 having the plurality of contact holes 181 and 182 and a hole 193a is formed on the upper gate insulating layer 180 and the second control electrode 124b by photolithography.

Figure 8:
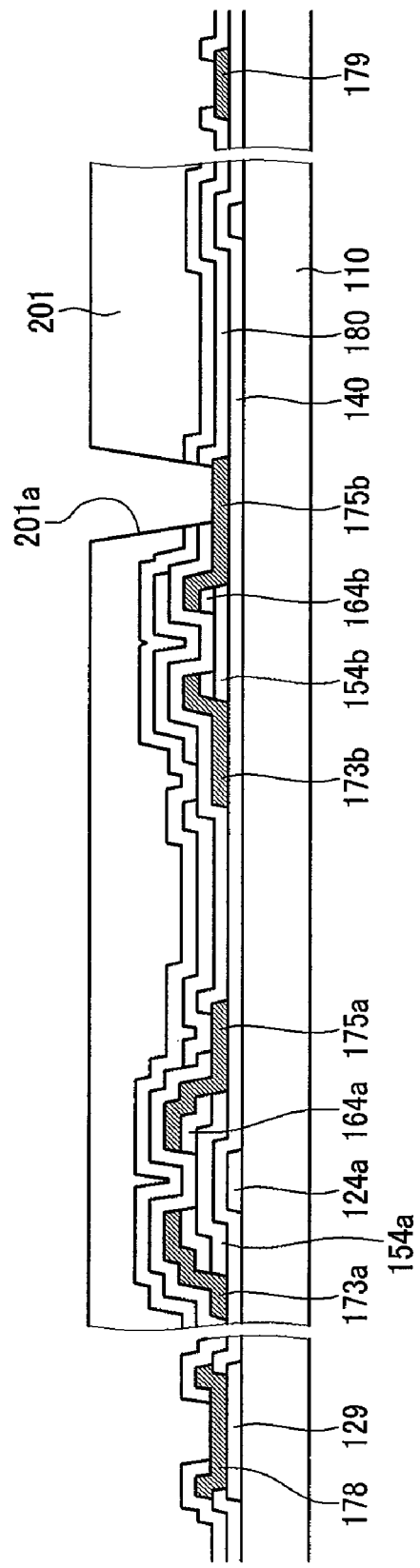

Subsequently, as shown in FIG. 8, the interlayer insulating layer 201 having the plurality of contact holes 201a is formed on the protective member 193.

Figure 9:
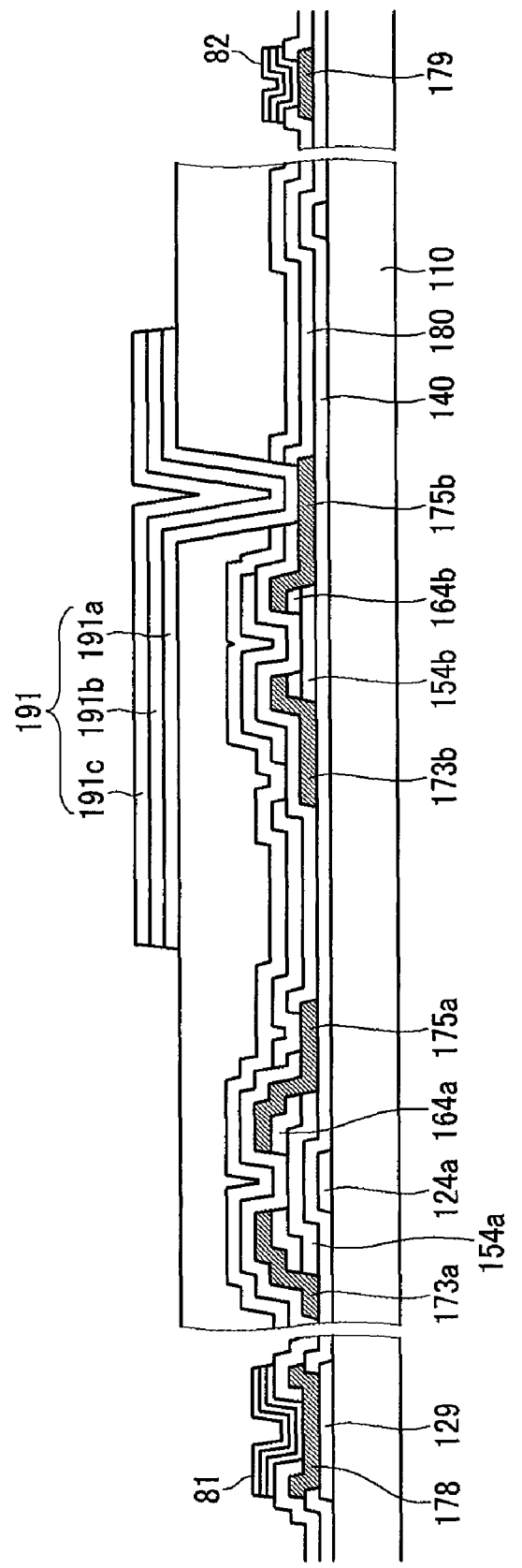

Next, as shown in FIG. 9, ITO, Ag, and ITO are deposited on the interlayer insulating layer 201 and the second pad unit 179, and are then subjected to photolithography to form the plurality of pixel electrodes 191 and the plurality of contact assistants 81 and 82.

Figure 10:
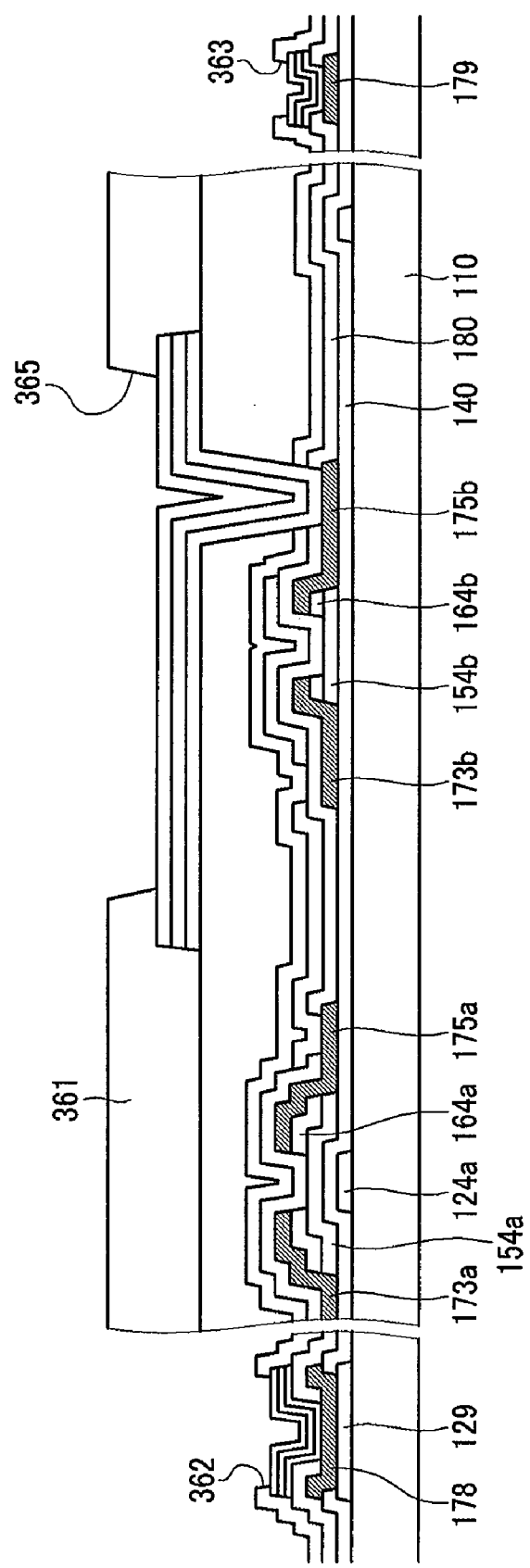

Then, as shown in FIG. 10, a photosensitive organic layer is formed on the plurality of pixel electrodes 191, the interlayer insulating layer 201, and the plurality of contact assistants 81 and 82, and is subjected to exposure and development to form the plurality of protective partitions 362 and 363 and the partition 361 having the plurality of openings 365.

The plurality of protective partitions 362 and 363 having a step lower than the partition 361 can be formed using a slit mask.

Next, as shown in FIG. 3, the light emitting member 370 including the hole transport layer (not shown) and the emission layer (not shown) is formed in the opening 365. The light emitting member 370 can be formed by a solution process or a deposition process, such as an Inkjet printing process, and when the Inkjet printing process including moving an Inkjet head (not shown) and dripping a solution to the opening 365 is used, each layer is formed and followed by a drying step.

Then, the common electrode 270 is formed on the partition 361 and the light emitting member 370.

As above, in the present exemplary embodiment, the switching thin film transistor is formed as a bottom gate structure and the driving thin film transistor is formed as a top gate structure.

However, the present exemplary embodiment is not limited thereto. Therefore, the switching thin film transistor may be formed as a top gate structure and the driving thin film transistor may be formed as a bottom gate structure.

In any case, even when the switching thin film transistor and the driving thin film transistor are formed as other structures, the common layers are integrated to reduce the number of masks, making it possible to simplify the processes.

Also, the present exemplary embodiment is formed as a top-emission structure that emits light from the light emitting member 370 in a direction where the common electrode 270 is formed; however, the present exemplary embodiment is not limited thereto. Accordingly, the present exemplary embodiment may be formed as a bottom-emission structure by changing the positions of the common electrode 270 and the pixel electrode 191, making it possible to emit light from the light emitting member 370 in an opposite direction to that of the top emission structure.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display comprising:
   a substrate;
   a first signal line disposed on the substrate, the first signal line comprising a first pad unit;
   a second signal line intersecting the first signal line, the second signal line comprising a second pad unit;
   a first thin film transistor electrically connected to the first signal line and the second signal line;
   a second thin film transistor electrically connected to the first thin film transistor;
   a pixel electrode electrically connected to the second thin film transistor;
   a common electrode facing the pixel electrode;
   a light emitting member disposed between the pixel electrode and the common electrode;
   a contact assistant disposed on the first pad unit and the second pad unit; and
   a protective partition enclosing the contact assistant.

2. The organic light emitting diode display according to claim 1, further comprising
   a pad unit assistant member disposed between the first pad unit and the contact assistant.

3. The organic light emitting diode display according to claim 2, wherein
   the pad unit assistant member comprises the same material as the second signal line.

4. The organic light emitting diode display according to claim 1, further comprising
   a partition disposed on the pixel electrode.

5. The organic light emitting diode display according to claim 4, wherein the partition comprises the same material as the protective partition.

6. The organic light emitting diode display according to claim 5, wherein the thickness of the partition is greater than that of the protective partition.

7. The organic light emitting diode display according to claim 6, wherein the protective partition comprises an organic insulating material.

8. The organic light emitting diode display according to claim 6, wherein the protective partition comprises an inorganic material.

9. The organic light emitting diode display according to claim 1, wherein the pixel electrode comprises the same material as the contact assistant.

10. The organic light emitting diode display according to claim 9, wherein the contact assistant comprises a lower transparent electrode,
    a reflecting electrode disposed on the lower transparent electrode, and
    an upper transparent electrode disposed on the reflecting electrode.

11. The organic light emitting diode display according to claim 10, wherein the reflecting electrode comprises at least one of silver (Ag), palladium (Pd), and platinum (Pt).

* * * * *